(12) United States Patent
Hung

(10) Patent No.: US 8,435,649 B2
(45) Date of Patent: May 7, 2013

(54) SILVERY WHITE FILM STRUCTURE, METHOD FOR MAKING THE SAME, AND ELECTRONIC DEVICE HAVING THE SAME

(75) Inventor: Hsin-Chin Hung, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 174 days.

(21) Appl. No.: 12/949,812

(22) Filed: Nov. 19, 2010

(65) Prior Publication Data

US 2012/0045654 A1   Feb. 23, 2012

(30) Foreign Application Priority Data

Aug. 19, 2010  (TW) .................................. 99127655

(51) Int. Cl.
  *B32B 9/00*  (2006.01)
(52) U.S. Cl.
  USPC ........... 428/697; 428/469; 428/472; 428/698; 428/699; 428/701; 428/702
(58) Field of Classification Search .................. 428/469, 428/472, 697, 698, 699, 701, 702
  See application file for complete search history.

(56) References Cited

U.S. PATENT DOCUMENTS

| | | | | |
|---|---|---|---|---|
| 4,052,530 A | * | 10/1977 | Fonzi | 428/698 |
| 4,180,400 A | * | 12/1979 | Smith et al. | 428/469 |
| 4,357,382 A | * | 11/1982 | Lambert et al. | 428/457 |
| 4,714,660 A | * | 12/1987 | Gates, Jr. | 428/698 |
| 4,746,563 A | * | 5/1988 | Nakano et al. | 428/701 |
| 6,641,939 B1 | * | 11/2003 | Lee et al. | 428/699 |
| 6,713,172 B2 | * | 3/2004 | Ljungberg et al. | 428/697 |
| 6,726,987 B2 | * | 4/2004 | Kathrein et al. | 428/472 |
| 7,939,181 B2 | * | 5/2011 | Ramm et al. | 428/701 |
| 8,003,231 B2 | * | 8/2011 | Yamamoto | 428/697 |
| 8,071,211 B2 | * | 12/2011 | Koike et al. | 428/702 |
| 8,080,323 B2 | * | 12/2011 | Ban et al. | 428/698 |
| 8,129,040 B2 | * | 3/2012 | Quinto et al. | 428/697 |

* cited by examiner

*Primary Examiner* — Archene Turner
(74) *Attorney, Agent, or Firm* — Altis Law Group, Inc.

(57) ABSTRACT

A white film structure includes a combining layer and a color layer. The combining layer is formed on a surface of a substrate and is made of chromium nitride. The color layer is formed on the combining layer and is made of a mixture of alumina and titanium oxide. A weight percent of the aluminum in the color layer is more than that of the titanium in the color layer.

4 Claims, 7 Drawing Sheets

| | | Power (KW) | | | Flow rate of Nitrogen (sccm) | Flow rate of Oxygen (sccm) | Flow rate of Argon (sccm) | Bias on the substrate (V) / current (A) |
|---|---|---|---|---|---|---|---|---|
| | | Chromium target | Aluminum target | Titanium target | | | | |
| Parameters of coating | Combining layer | 20 | - | - | 240 | - | 60 | 200/6A |
| | Color layer | - | 30 | 9 | - | 60 | 180 | 200/ 16A-17A |

| | | Coating temperature (°C) | Coating time (min) | Working pressure (mtorr) | Condensing temperature (°C) | Revolution speed (rpm) | Rotation speed (rpm) |
|---|---|---|---|---|---|---|---|
| Parameters of coating | Combining layer | 200 | 10 | 4.1 | -135 | 2 | 8 |
| | Color layer | 200 | 90 | 3.95 | -135 | 2 | 8 |

| | Wear resistance | average | | | |
|---|---|---|---|---|---|
| Testing result | Color (L*; a*; b*) | Rough surface | Smooth surface | Grooved surface | Rough surface of B-cover |
| | | (72.85; 1.26; 3.36) | (72.85; 1.26; 3.36) | (73.90; 1.28; 2.85) | (75.05; 1.42; 3.39) |

FIG. 7

SILVERY WHITE FILM STRUCTURE, METHOD FOR MAKING THE SAME, AND ELECTRONIC DEVICE HAVING THE SAME

BACKGROUND

1. Technical Field

The present disclosure relates to a silvery white film structure, a method for making the silvery white film structure, and an electronic device having the silvery white film structure.

2. Description of Related Art

Shells of electronic devices are often coated with a silvery white film to obtain metallic-finished appearance. Current silvery white film is a coating of alumina and silicon dioxide. However, the silicon dioxide lowers the gray level of the silvery white color, which makes the color look washed out.

Therefore, it is desirable to provide a new silvery white film structure, a method for making the silvery white film, and an electronic device having the silvery white film, which can overcome the above-mentioned limitations.

BRIEF DESCRIPTION OF THE DRAWINGS

FIG. 7 is a table showing coating parameters and testing results of the white film structure of FIG. 1.

DETAILED DESCRIPTION

Figure 1:
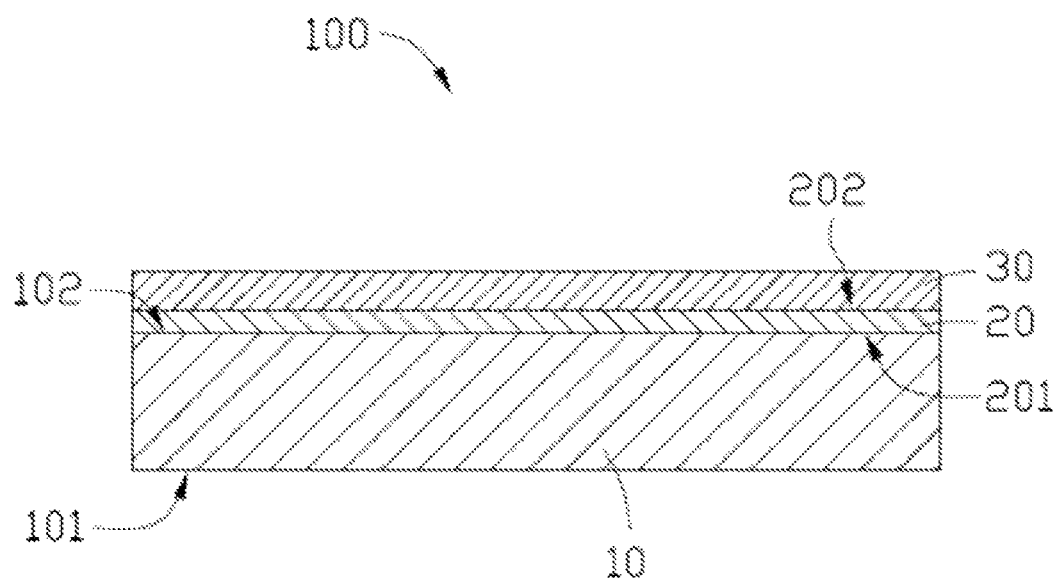
FIG. 1 is a cross-sectional view of a white film structure according to an exemplary embodiment.

Referring to FIG. 1, a white film structure 100 formed on a substrate 10, according to an exemplary embodiment, includes a combining layer 20 formed on the substrate 10 and a color layer 30 formed on the combining layer 20.

The substrate 10 can be a shell of a portable electronic device and includes a first bottom surface 101 and a first upper surface 102 opposing the first bottom surface 101. The substrate 10 is made of solid materials, such as metal, or plastic. In the present embodiment, the substrate 10 is made of stainless steel.

The combining layer 20 is formed on the first upper surface 102 of the substrate 10. The combining layer 20 includes a second bottom surface 201 and a second upper surface 202 opposing the second bottom surface 201. The second bottom surface 201 contacts the first upper surface 102 of the substrate 10.

The combining layer 20 is made of chromium nitride and is coated onto the substrate 10 by various technologies, such as magnetron sputtering. CrNx represents the molecular formula of the combining layer 20, where x is greater than 0 and less than 1. The combining layer 20 enhances the adhesion between the color layer 30 and the substrate 10.

The color layer 30 is formed on the second upper surface 202 of the combining layer 20 by various technologies, such as magnetron sputtering. The color layer 30 is made of a mixture of alumina and titanium oxide. The weight percent of the aluminum in the color layer 30 is more than that of the titanium in the color layer 30. Aluminum is the main factor resulting in the silvery white color of the film structure 100. The film structure 100 shows slightly different colors resembling the silvery white color when the weight percentage of the titanium in the color layer 30 and the thickness of the color layer 30 varies.

Figure 2:
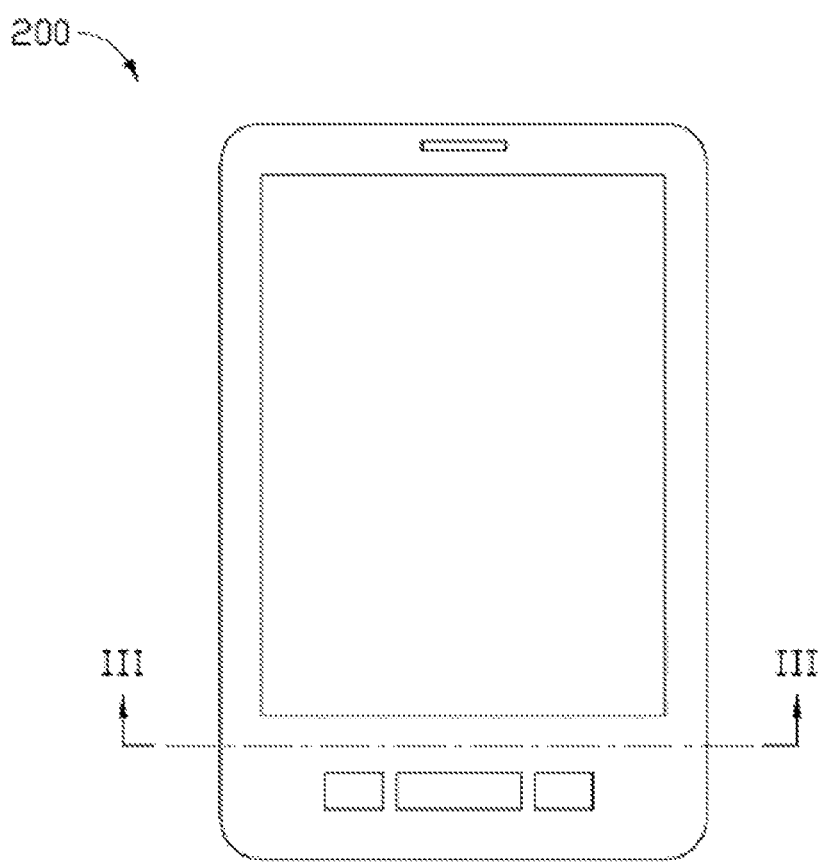
FIG. 2 is a schematic view of an electronic device having the white film structure of FIG. 1.
Figure 3:
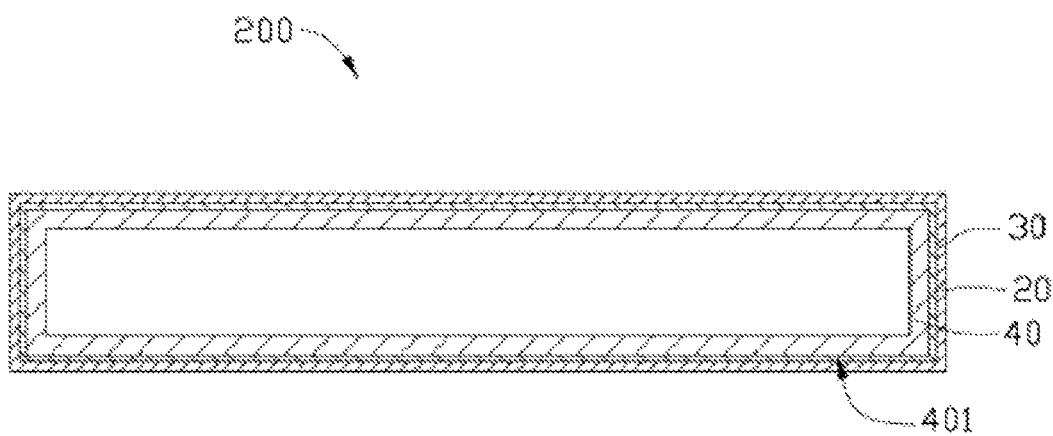
FIG. 3 is a cross-sectional view of the electronic device taken along the line III-III of FIG. 2.

Referring to FIGS. 2-3, an electronic device 200, according to an exemplary embodiment, includes the film structure 100 of FIG. 1. The electronic device 200 includes a housing 40 which is the equivalent of the substrate 10 of FIG. 1. The housing 40 includes an exterior surface 401. The combining layer 20 is formed on the exterior surface 401. The color layer 30 is formed on the combining layer 20. In the present embodiment, the electronic device 200 is a cell phone.

Figure 4:
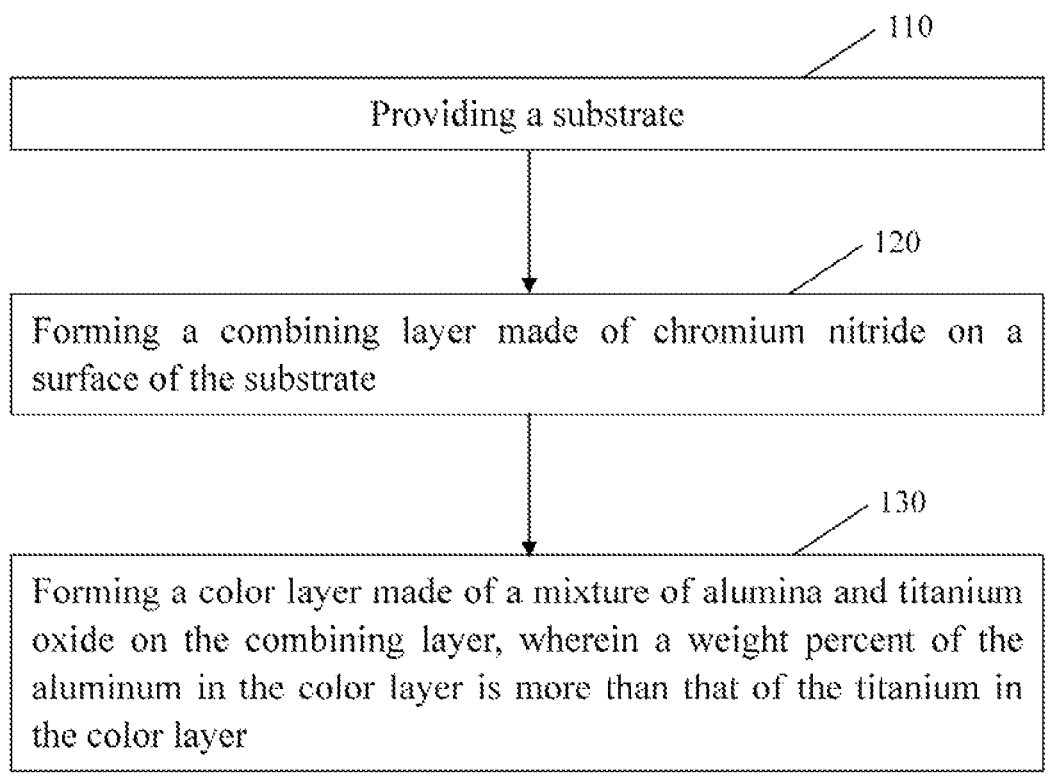
FIG. 4 is a flow chart of one embodiment of a method for making the white film structure of FIG. 1.
Figure 5:
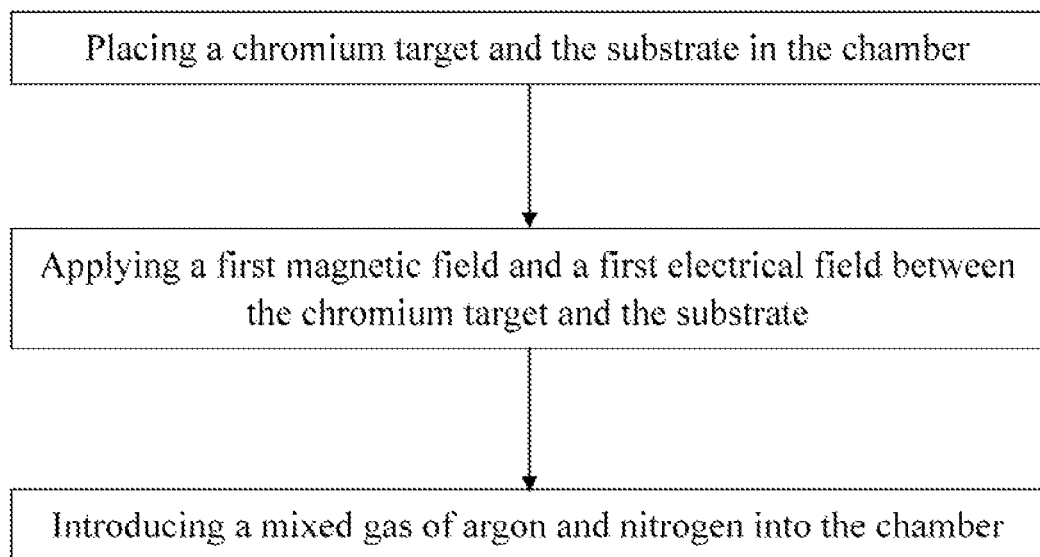
FIG. 5 is a flow chart of one embodiment of a method for making the combining layer of FIG. 1.
Figure 6:
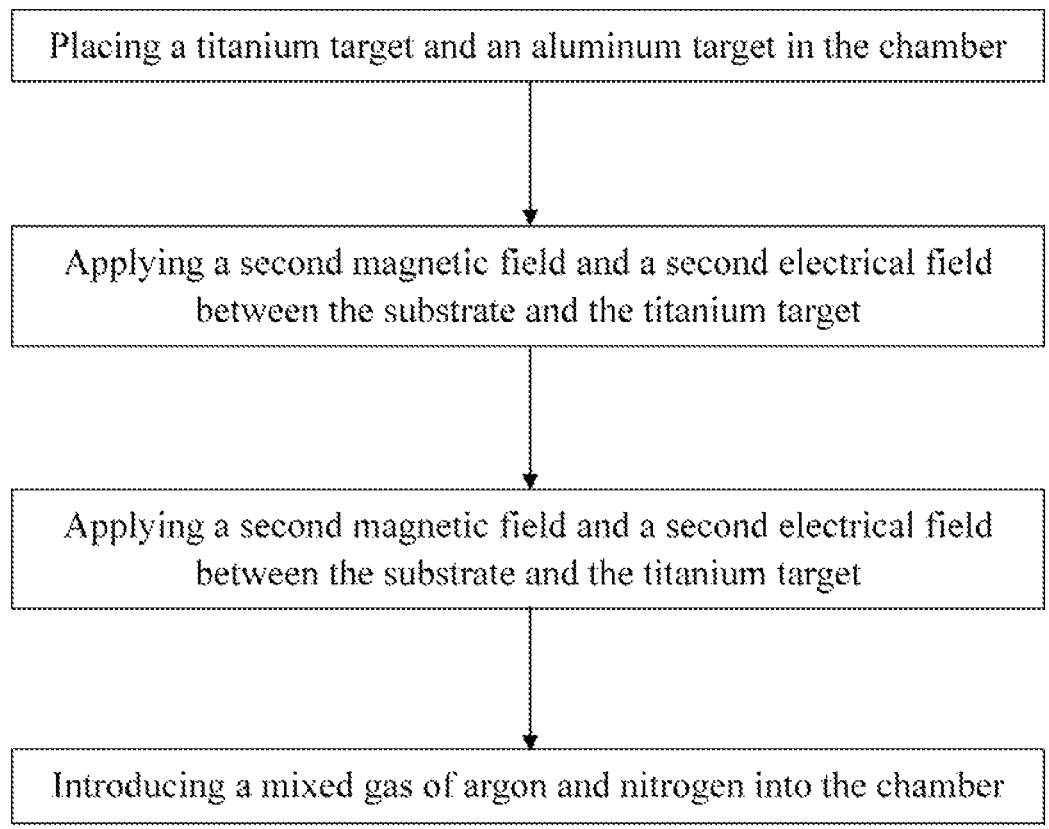
FIG. 6 is a flow chart of one embodiment of a method for making the color layer of FIG. 1.

Referring to FIGS. 4 to 6, one embodiment of a method for making the film structure 100 includes the following steps.

In step 110, the substrate 10 is provided. The first upper surface 102 of the substrate 10 can be rough or smooth.

In step 120, the combining layer 20 is formed on the first upper surface 102 of the substrate 10 by magnetron sputtering.

Magnetron sputtering is performed in a magnetron sputtering device (not shown). The magnetron sputtering device defines a chamber for carrying out the sputtering therein. Before deposition of the combining layer 20, the substrate 10 is placed in the chamber. The chamber is then pressurized to a working pressure, and the working pressure of the chamber is kept during the sputtering. In the present embodiment, the working pressure is about 4.1 millitorr.

The chamber can be cooled by a cooling system (not shown) during pressurization of the chamber of the magnetron sputtering device, which enhances the efficiency of pressurizing. In this embodiment, the temperature of the chamber can be cooled to about −135° C. After the chamber is pressurized, the chamber can be heated to a required temperature of about 200° C.

Then, a chromium target is placed in the chamber. A first magnetic field and a first electrical field are applied between the chromium target (a cathode) and the substrate (an anode). Then, a mixed gas of nitrogen and argon is continually introduced into the chamber during the coating of the combining layer 20. The first magnetic field is orthogonal to the first electrical field. The nitrogen serves as a reactive gas. The argon serves as a working gas. In the first electrical field, the argon is ionized to argon ions (i.e., with positive charge) and electrons. Argon ions are accelerated by the first electrical field to bombard the chromium target. A number of chromium atoms then emit/release from the chromium target. The chromium atoms react with the nitrogen to form chromium nitride. The chromium nitride is then deposited on the first upper surface 102 of the substrate 10, thus forming the combining layer 20.

In step 130, the color layer 30 is deposited on the second upper surface 202 of the combining layer 20 by magnetron sputtering.

After the combining layer 20 is coated on the substrate 10, the chromium target is removed, the mixed gas of nitrogen and argon is shut off, and the chamber is pressurized again. Before pressurizing the chamber, the chamber can also be cooled by the cooling system. In the present embodiment, the temperature of the chamber can also be cooled to about −135° C. During the process of forming the color layer 30, a working pressure of the chamber is kept at about 3.95 millitorr.

Then, a titanium target and an aluminum target are placed in the chamber. A second magnetic field and a second electrical field are applied to the titanium target (the first cathode) and the substrate 10 (the anode). A third magnetic field and a third electrical field are applied to the aluminum target (the second cathode) and the substrate 10 (the anode). The second magnetic field is orthogonal to the second electrical field, and the third magnetic field is orthogonal to the third electrical field. A mixed gas of oxygen and argon is continually introduced to the chamber in the deposition of the color layer 30. The oxygen serves as a reactive gas, and the argon functions as a working gas. In the second and third electrical fields, the argon is ionized to argon ions and electrons. The argon ions are accelerated to bombard the titanium target and the aluminum target, and thereby the titanium target and the aluminum target release titanium atoms and aluminum atoms. The aluminum atoms react with the oxygen to form alumina. The titanium atoms react with the oxygen to form titanium oxide. A mixture of the alumina and the titanium oxide is deposited on the second upper surface 202 of the combining layer 20, thus forming the color layer 30.

The film structure 100 shows slightly different colors resembling the silvery white color when the weight percent of the titanium and the thickness of the color layer 30 vary. The weight percent of the element is mainly determined by the power applied to the corresponding target. The thickness of the color layer 30 is mainly decided by the time of the coating.

The power applied to the aluminum target is larger than that applied to the titanium target. Thus, the weight percentage of aluminum in the color layer 30 can be controlled to be greater than that of titanium in the color layer 30. In one embodiment, the power fed to the aluminum target is about 30 kilowatt (KW), while that applied to the titanium target is about 9 KW. As a result, a ratio of the weight percentage of the aluminum compared to that of the titanium is about 30:9.

In the present embodiment, during the deposition of the combining layer 20 and the color layer 30, the substrate 10 is driven to rotate around a central axis thereof and, simultaneously, to rotate around a central axis of the chamber. As such, uniformity of the combining layer 20 and the color layer 30 is improved. A revolution speed (i.e., the speed of the rotation around the central axis of the chamber) of the substrate 10 is about 2 revolution per minute (RPM), and a rotation speed (i.e., the speed of the rotation around the central axis around the substrate 10) of the substrate is about 8 RPM.

Referring to FIG. 7, coating parameters and testing results of the film structure 100 are shown. The unit of a flow rate of different gases (e.g., argon) is standard cubic centimeter per minute (sccm).

While various embodiments have been described, it is to be understood that the disclosure is not limited thereto. To the contrary, various modifications and similar arrangements (as would be apparent to those skilled in the art), are also intended to be covered. Therefore, the scope of the appended claims should be accorded the broadest interpretation so as to encompass all such modifications and similar arrangements.

What is claimed is:

1. A silvery white film structure, comprising:
    a combining layer formed on a surface of a substrate and made of chromium nitride; and
    a color layer formed on the combining layer and made of a mixture of alumina and titanium oxide, wherein a weight percent of the aluminum in the color layer is more than that of the titanium in the color layer, a ratio of the weight percentage of the aluminum compared to that of the titanium is about 30:9.

2. The film structure of claim 1, wherein a molecular formula of the chromium nitride is represented by CrNx, where x is larger than 0 and less than 1.

3. The film structure of claim 1, wherein the substrate is made of stainless steel.

4. The film structure of claim 1, wherein the substrate is made of plastic.

* * * * *